US010103749B2

(12) United States Patent
Park et al.

(10) Patent No.: US 10,103,749 B2
(45) Date of Patent: Oct. 16, 2018

(54) LDPC DECODER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: In-Cheol Park, Daejeon (KR); Jaehwan Jung, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/599,550

(22) Filed: May 19, 2017

(65) Prior Publication Data

US 2018/0026658 A1 Jan. 25, 2018

(30) Foreign Application Priority Data

Jul. 21, 2016 (KR) .......................... 10-2016-0092552

(51) Int. Cl.
*H03M 13/11* (2006.01)
*G06F 11/10* (2006.01)
*H03M 13/29* (2006.01)
*H03M 13/37* (2006.01)
*H03M 13/00* (2006.01)

(52) U.S. Cl.
CPC ......... *H03M 13/1105* (2013.01); *G06F 11/10* (2013.01); *H03M 13/116* (2013.01); *H03M 13/1108* (2013.01); *H03M 13/1111* (2013.01); *H03M 13/1171* (2013.01); *H03M 13/2957* (2013.01); *H03M 13/3707* (2013.01); *H03M 13/6325* (2013.01); *H03M 13/6343* (2013.01)

(58) Field of Classification Search
CPC .................................................. H03M 13/1111
USPC ........................................................ 714/752
See application file for complete search history.

(56) References Cited

U.S. PATENT DOCUMENTS 8,707,144 B2 * 4/2014 Wang ................. H03M 13/1108
714/752
8,739,004 B2 * 5/2014 Olcay ................ H03M 13/1108
714/752
9,755,665 B1 * 9/2017 Chilappagari ..... H03M 13/1105
(Continued)

FOREIGN PATENT DOCUMENTS

KR 1020120053122 5/2012

*Primary Examiner* — Min Huang
(74) *Attorney, Agent, or Firm* — IP & T Group LLP

(57) ABSTRACT

An operation method of a LPC decoder includes: initializing variable nodes of a Tanner graph representing a parity check matrix; performing a check node update to check nodes of the Tanner graph based on variable node values of the variable nodes; performing a variable node update when there are USC nodes among the updated check nodes as a result of the check node update; and repeating the performing of the check node update and the variable node update when there are USC nodes as the result of the check node update, wherein the performing of the variable node update includes: selecting among the variable nodes a predetermined number of variable nodes having a USC value greater than a threshold; and flipping the variable node values of the selected variable nodes, and wherein the USC value is a number of the USC nodes linked to one of the variable nodes.

12 Claims, 15 Drawing Sheets

(56) References Cited

U.S. PATENT DOCUMENTS

| | | | | |
|---|---|---|---|---|
| 2010/0042890 A1* | 2/2010 | Gunnam | ............ | H03M 13/1111 |
| | | | | 714/752 |
| 2012/0005551 A1* | 1/2012 | Gunnam | ............ | H03M 13/1108 |
| | | | | 714/752 |
| 2015/0358036 A1* | 12/2015 | Tseng | ................ | H03M 13/1128 |
| | | | | 714/755 |
| 2016/0274971 A1* | 9/2016 | Kang | ................. | G06F 11/1068 |

* cited by examiner

LDPC DECODER, SEMICONDUCTOR MEMORY SYSTEM AND OPERATING METHOD THEREOF

CROSS-REFERENCE TO RELATED APPLICATIONS

The present application claims priority of Korean Patent Application. No. 10-2016-0092552, filed on Jul. 21, 2016, which is incorporated herein by reference in its entirety.

BACKGROUND

1. Field

Various exemplary embodiments of the present invention relate to an LDPC decoder, a semiconductor memory system employing the LDPC decoder and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions may overlap. As the neighbouring threshold voltage distributions overlap, read data may include error bits.

FIG. 1 is threshold voltage distribution schematically illustrating program and erase states of a 3-bit MLC non-volatile memory device.

FIG. 2 is a threshold voltage distribution schematically illustrating program and erase states due to characteristic deterioration of the 3-bit MLC non-volatile memory device.

In an MLC non-volatile memory device, e.g., an MLC flash memory device capable of storing k-bit data in a single memory cell, the memory cell may have one of $2^k$ threshold voltage distributions. For example, the 3-bit MLC has one of 8 threshold voltage distributions.

Threshold voltages of memory cells programmed for the same data form a threshold voltage distribution due to characteristic differences between memory cells. In the 3-bit MLC non-volatile memory device as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween. Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a method for precisely reading data stored in memory cells of a semiconductor memory device.

SUMMARY

Various embodiments of the present invention are directed to an LDPC (Low Density Parity Check) decoder, a semiconductor memory system employing the LDPC and an operating method thereof capable of precisely reading data stored in memory cells of the semiconductor memory device.

In accordance with an embodiment of the present invention, an operation method of an LDPC decoder may include: initializing variable nodes of a Tanner graph representing a parity check matrix defining an LDPC code; performing a check node update to check nodes of the Tanner graph based on variable node values of the variable nodes performing a variable node update when there are one or more unsatisfied syndrome check (USC) nodes among the updated check nodes as a result of the check node update; and repeating the performing of the check node update and the variable node update when there are one or more USC nodes as the result of the check node update, wherein the performing of the variable node update includes: selecting among the variable nodes a predetermined number of variable nodes having a USC value greater than a predetermined threshold; and flipping the variable node values of the selected variable nodes, and wherein the USC value is a number of the USC nodes linked to corresponding one of the variable nodes.

Preferably, the variable nodes may be selected according to an order of the USC values.

Preferably, the selecting the predetermined number of variable nodes may include: dividing the variable nodes into a predetermined number of groups; and selecting variable nodes having greatest. USC values in the respective groups.

Preferably, the predetermined threshold may be variable according to a repetition number of the variable node update.

Preferably, the predetermined maximum number may be variable according to a repetition number of the variable node update.

Preferably, the operation method of the LDPC decoder may further include determining a decoding of the LDPC decoder as successful when there is no USC nodes as the result of the check node update.

In accordance with an embodiment of the present invention, a Low Density Parity Check (WPC) decoder may include: a first unit suitable for initializing variable nodes of a Tanner graph representing a parity check matrix defining an LDPC code; a second unit suitable for performing a check node update to check nodes of the Tanner graph based on variable node values of the variable nodes; and a third unit suitable for performing a variable node update when there is one or more unsatisfied syndrome check (USC) nodes among the updated check nodes as a result of the check node update, wherein the second and third units repeat the check node update and the variable node update when there is one or more USC nodes as the result of the check node update, wherein the third unit includes: a first part suitable for selecting, among the variable nodes, a predetermined number of variable nodes having an USC value greater than a predetermined threshold; and a second part suitable for flipping the variable node values of the selected variable nodes, and wherein the USC value is a number of the USC nodes linked to corresponding one of the variable nodes.

Preferably, the first part may select the variable nodes in order of the USC values among the variable nodes having the USC value.

Preferably, the first part may select the variable nodes by dividing the variable nodes into the predetermined number of groups, and selecting variable nodes having greatest USC values in the respective groups.

Preferably, the predetermined threshold may be variable according to a repetition number of the variable node update.

Preferably, the predetermined maximum number may be variable according to a repetition number of the variable node update.

Preferably, the LDPC decoder may further include a fourth unit suitable for determining a decoding of the LDPC decoder as successful when there is no USC nodes as the result of the check node update.

In accordance with an embodiment of the present invention, a semiconductor memory system may include: a semiconductor memory device; and a Low Density Parity Check (LDPC) decoder, wherein the LDPC decoder includes: a first unit suitable for initializing variable nodes of a Tanner graph representing a parity check matrix defining an LDPC code; a second unit suitable for performing a check node update to check nodes of the Tanner graph based on variable node values of the variable nodes; and a third unit suitable for performing a variable node update when there is one or more unsatisfied syndrome check (USC) nodes among the updated check nodes as a result of the check node update, wherein the second and third units repeat the check node update and the variable node update when there is one or more USC nodes as the result of the check node update, wherein the third unit includes: a first part suitable for selecting, among the variable nodes, a predetermined number of variable nodes having an USC value greater than a predetermined threshold; and a second part suitable for flipping the variable node values of the selected variable nodes and wherein the USC value is a number of the USC nodes linked to corresponding one of the variable nodes.

Preferably, the first part may select the variable nodes according to an order of the USC values among the variable nodes having the USC value.

Preferably, the first part may select the variable nodes by dividing the variable nodes into a predetermined number of groups, and selecting variable nodes having greatest USC values in the respective groups.

Preferably, the predetermined threshold may be variable according to a repetition number of the variable node update.

Preferably, the predetermined maximum flip number may be variable according to a repetition number of the variable node update.

Preferably, the LDPC decoder may further include a fourth unit suitable for determining a decoding of the LDPC decoder as successful when there is no USC nodes as the result of the check node update.

In accordance with various embodiments of the present invention, data stored in memory cells of a semiconductor memory device may be precisely read.

BRIEF DESCRIPTION OF THE DRAWINGS

These and other features and/or advantages of the present invention will become apparent to those skilled in the art to which this invention belongs in view of the following description of various embodiments of the present invention in reference to the accompanying drawings in which.

Figure 3:
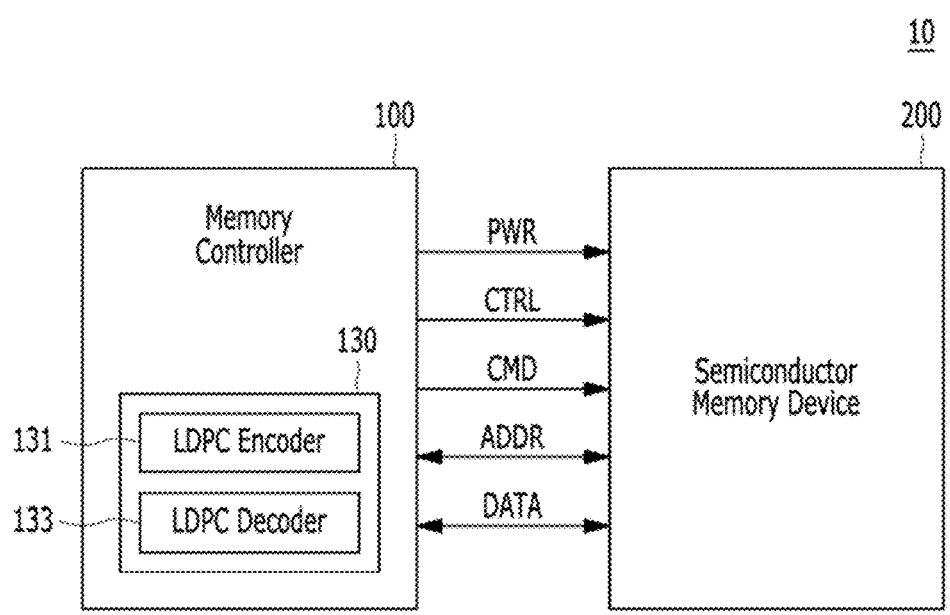
FIG. 3 is a block diagram schematically illustrating semiconductor memory system in accordance with an embodiment of the present invention.

8F is a simulation graph illustrating an operation of the LDPC decoder in FIG. 3.

Figure 9:
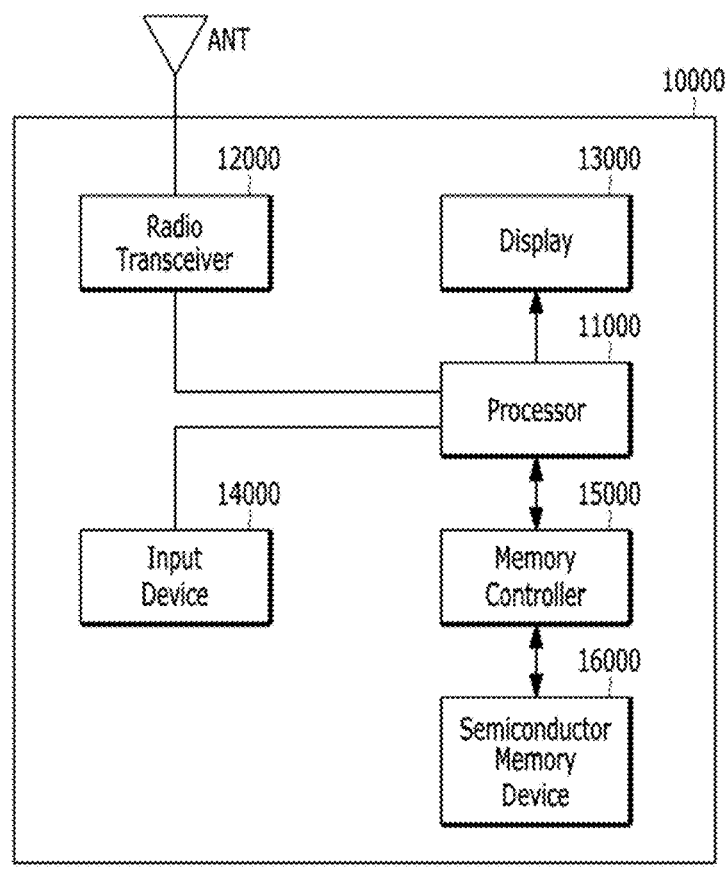

FIG. 9 is a block diagram schematically illustrating an electronic device including a semiconductor memory system in accordance with an embodiment of the present invention.

Figure 10:
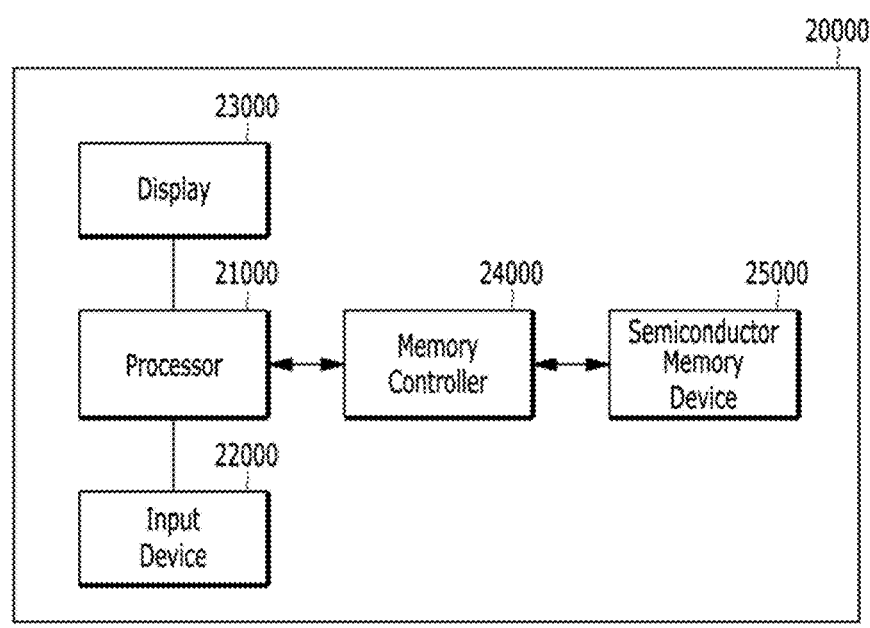

FIG. 10 is a block diagram schematically illustrating an electronic device including a semiconductor memory system in accordance with another embodiment of the present invention.

Figure 11:
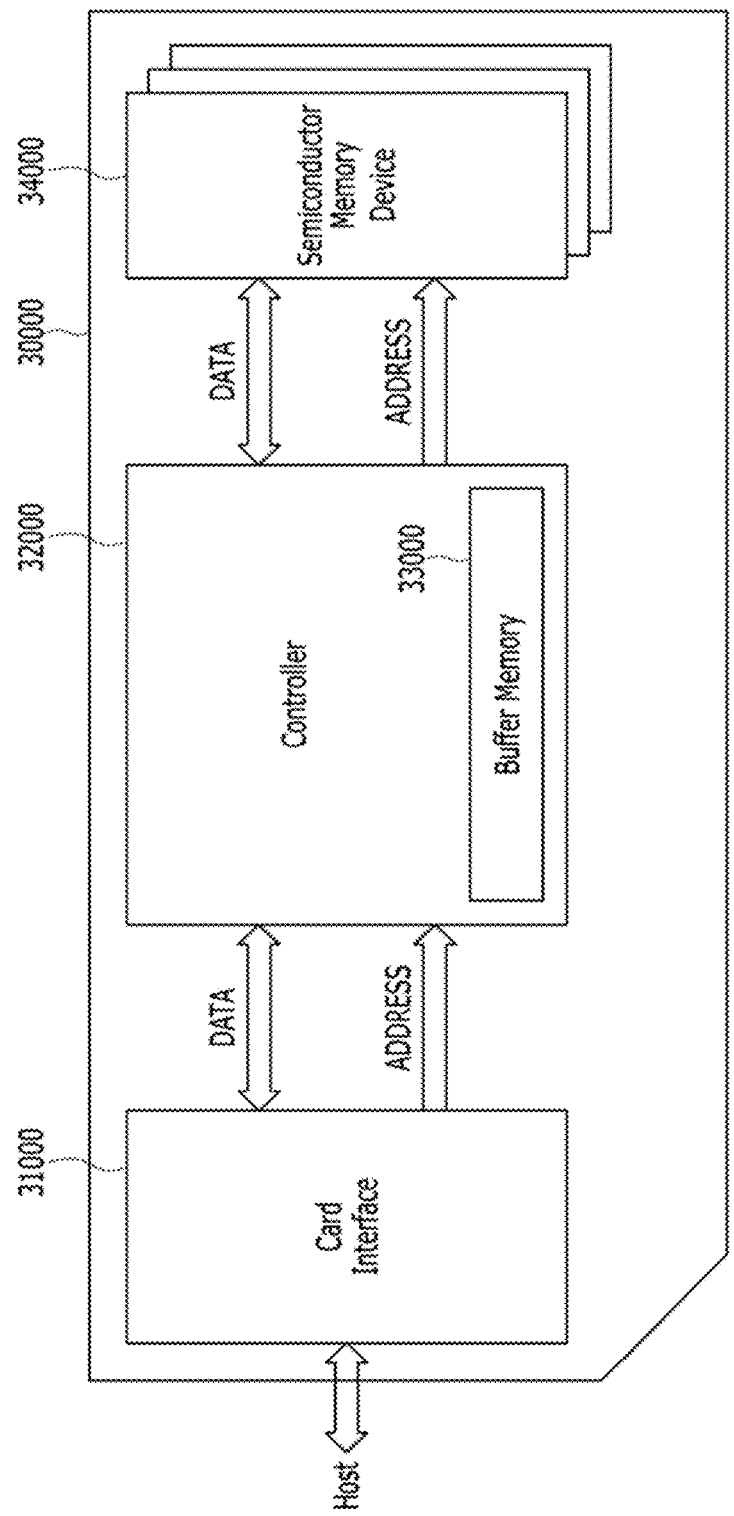

FIG. 11 is a block diagram schematically illustrating an electronic device including a semiconductor memory system in accordance with yet another embodiment of the present invention.

Figure 12:
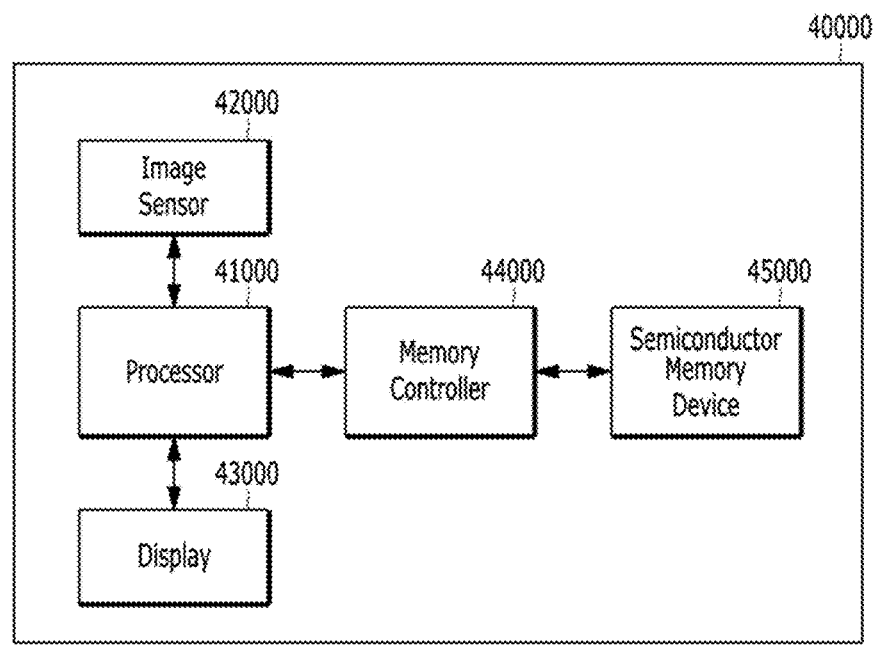

FIG. 12 is a block diagram schematically illustrating an electronic device including a semiconductor memory system in accordance with yet another embodiment of the present invention.

Figure 13:
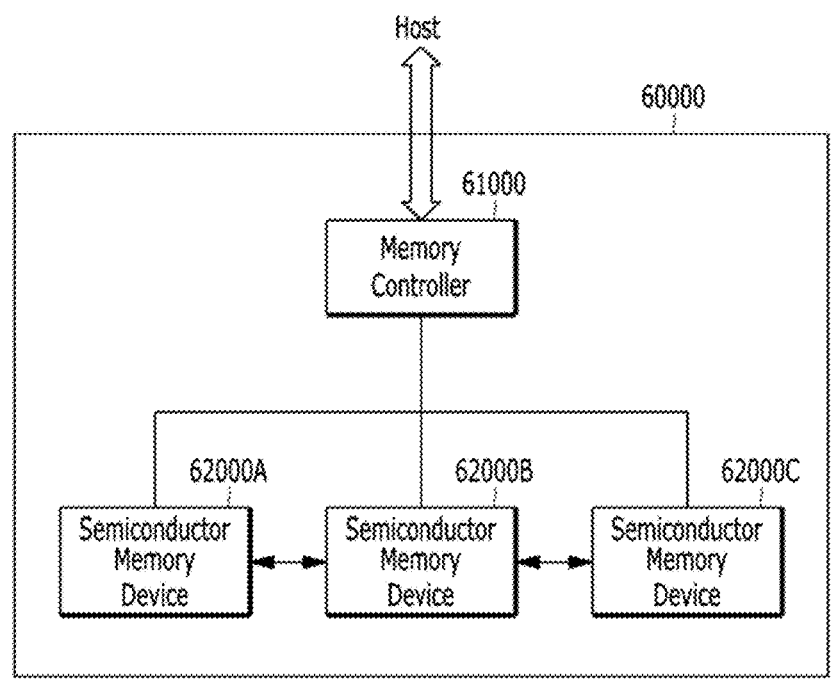

FIG. 13 is a block diagram schematically illustrating an electronic device including a semiconductor memory system in accordance with yet another embodiment of the present invention.

Figure 14:
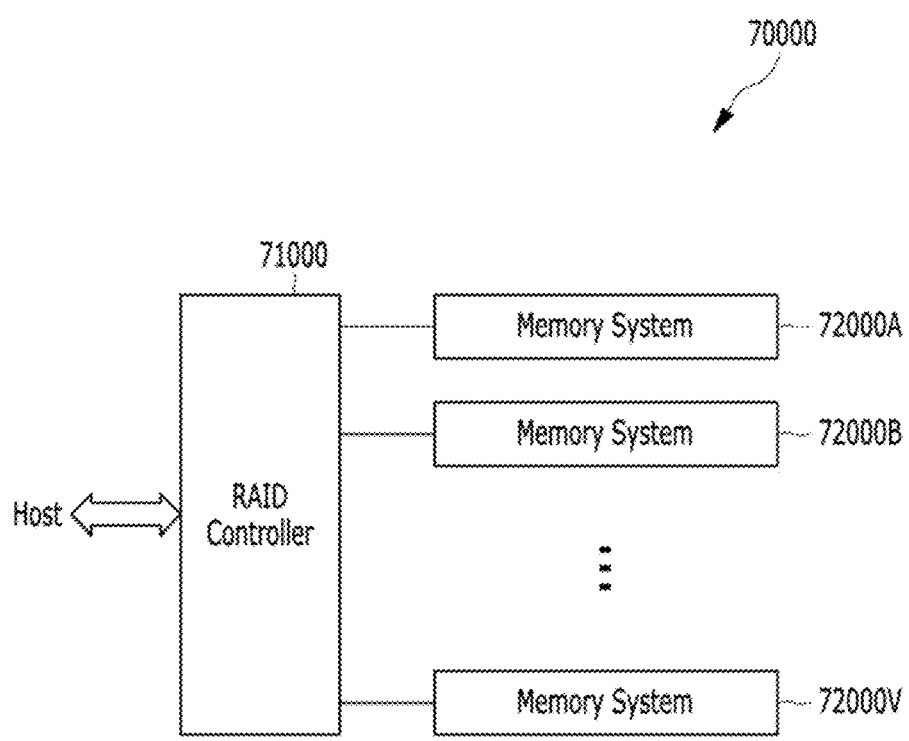

FIG. 14 is a block diagram of a data processing system including the electronic device shown in FIG. 13, according to an embodiment of the present invention.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art. The scope of the present invention will be understood through the claims of the present invention.

It is noted that the drawings are not necessarily to scale and, in some instances, proportions may have been exaggerated in order to more clearly illustrate the various elements of the embodiments.

Also, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 4A:
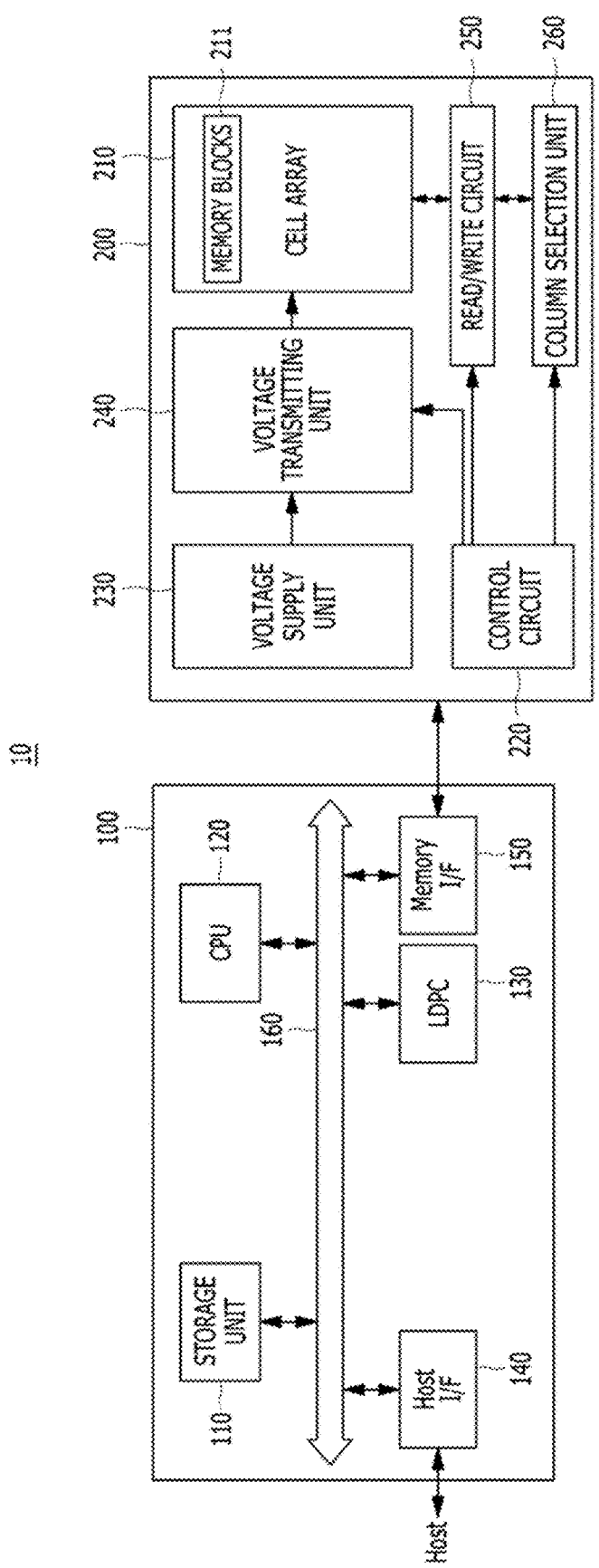
FIG. 4A is a block diagram further illustrating in more detail the semiconductor memory system of FIG. 3.
Figure 4B:
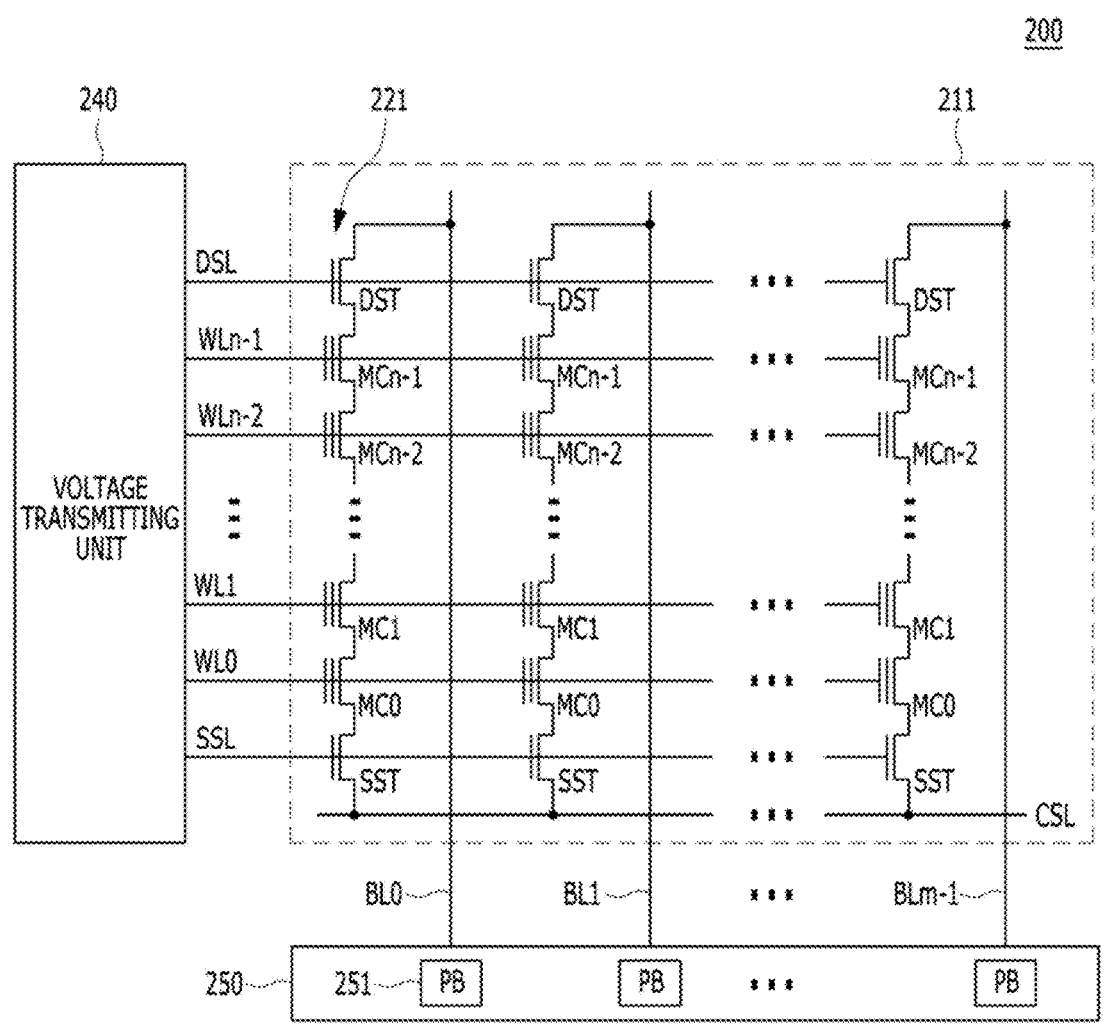
FIG. 4B is a circuit diagram illustrating an exemplary configuration of a memory block employed in the semiconductor memory system of FIG. 4A.
Figure 5:
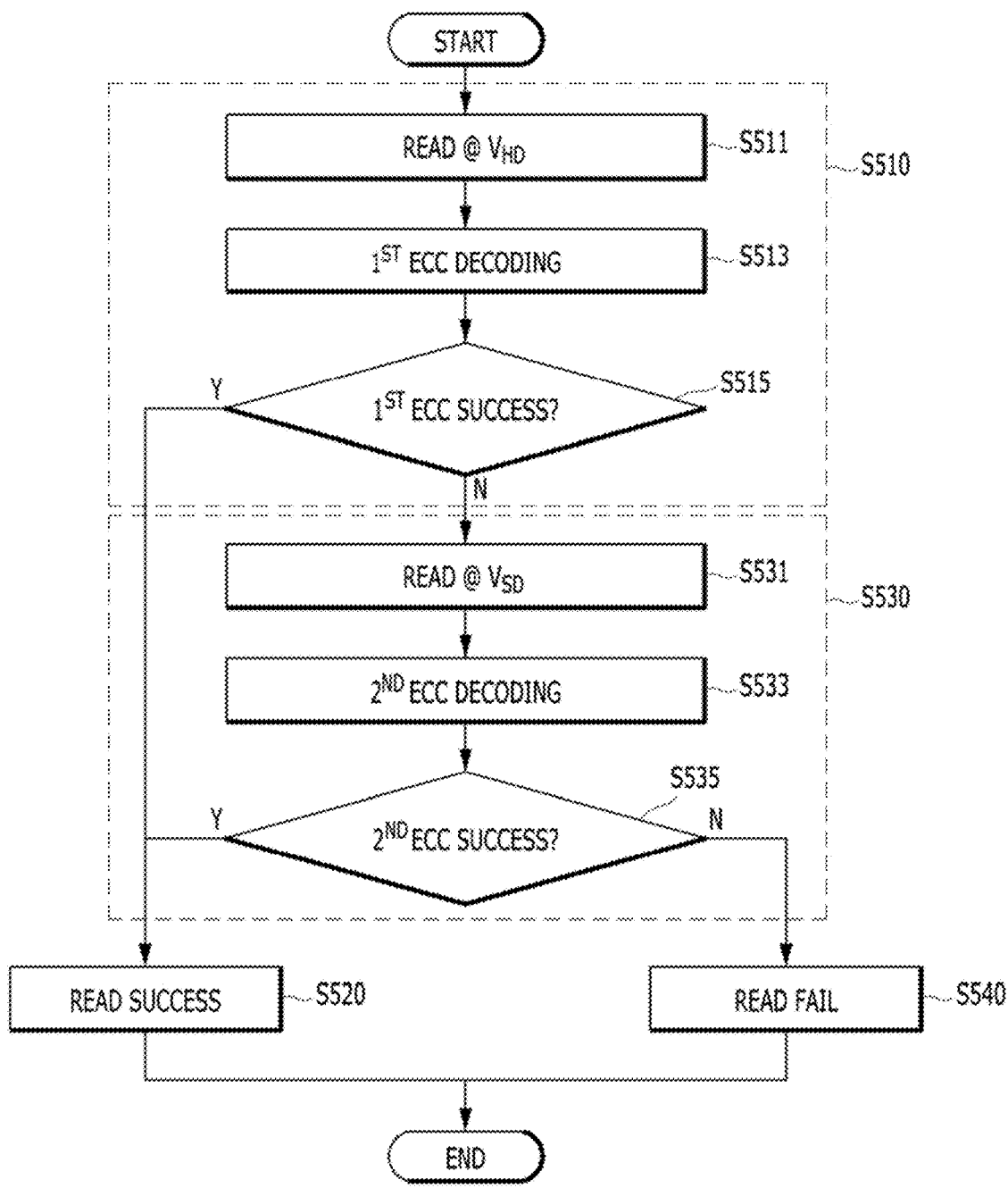
FIG. 5 is a flowchart illustrating an operation of a memory controller employed in the semiconductor memory system shown in FIG. 4A.

Referring now to FIGS. 3 to 5, a semiconductor memory system 10 is provided, according to an embodiment of the present invention. The semiconductor memory system 10 may include a semiconductor memory device 200 operatively coupled to a memory controller 100.

The semiconductor memory device 200 may perform one or more of an erase, a program and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and so on.

The memory controller 100 may control the overall operations of the semiconductor memory device 200. The memory controller 100 may include an LDPC unit 130 for correcting error bits. The LDPC unit 130 may include an LDPC encoder 131 and an LDPC decoder 133.

The LDPC encoder 131 may perform error correction encoding on data to be programmed into the semiconductor memory device 200 to output data to which parity bits are added. The encoded data with the parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds the error correction capacity of the LDPC unit 130, the LDPC unit 130 may not correct the error bits. In this case, the LDPC unit 130 may generate an error correction fail signal.

The LDPC unit 130 may correct an error through a low-density parity-check (LDPC) code. The LDPC unit 130 may include all circuits, systems, or devices for error correction. The LDPC code may be a binary LDPC code or a non-binary LDPC code.

The LDPC unit 130 may perform an error bit correcting operation using hard decision read data and/or soft decision read data. In an embodiment, the LDPC 130 may perform an error bit correcting operation using soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semi conductor memory system 10 may be provided as one of various elements comprising an electronic device such as a computer, an ultra-mobile PC (UMPC), a workstation, a net-book, computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or of a computing system.

Referring to FIG. 4A, in an embodiment, the memory controller 100 may include, in addition to the LDPC unit 130, a storage unit 110, a CPU 120, a host interface 140, a memory interface 150 and a system bus 160.

The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E, a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The LDPC unit 130 may detect and correct errors included in the data read from the semiconductor memory device 200. The memory interface 150 may interface with the semiconductor memory device 200. The LDPC encoder 131 and the LDPC decoder 133 may be implemented as different and independent components even though FIG. 4A exemplarily shows the LDPC unit 130 including both of the LDPC encoder 131 and the LDPC decoder 133. The CPU 120 may perform various control operations.

In accordance with an exemplary embodiment of the present invention, during a program operation, the LDPC unit 130 may perform an LDPC encoding operation to an original data which is to be programmed to the semiconductor memory device 200. In such case, during the read operation, the LDPC unit 130 may perform an LDPC decoding operation to the LDPC-encoded data or a codeword, which is stored in the semiconductor memory device 200.

An original data is data as received from the host before being encoded LDPC by the encoding operation of the LDPC unit 130 during a program operation. The LDPC-encoded data are stored in the semiconductor memory device 200. The LDPC unit 130 may then restore the original data by performing an LDPC decoding operation to the LDPC-encoded data or to the codeword stored in the semiconductor memory device 200.

As discussed with reference to FIG. 5, the read operation to the data stored in the semiconductor memory device 200 may include a hard decision read operation of step S511 and a soft hard decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different voltages than the hard decision read voltage $V_{HD}$. For example, an additional read operation according to the soft decision read voltages $V_{SD}$ may be performed to the memory cell, which is read according to the hard decision read voltage $V_{HD}$.

The LDPC-encoded data or the codeword, which is stored in the semiconductor memory device 200 and is read through the hard decision read operation, may be decoded back to the original data by the LDPC unit 130.

The soft decision read operation includes generating a log likelihood ratio (LLR), which provides the reliability of the hard decision read data read through the hard decision read operation, according to the soft decision read voltages $V_{SD}$ rather than just the read operation to data stored in the semiconductor memory device 200.

The WPC unit 130 may perform the LDPC decoding operation to the LLR. The LDPC unit 130 may detect and correct the error of the LDPC-encoded data or the codeword read from the semiconductor memory device 200 through the LLR method.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211. The user data may be encoded as described above.

Referring to FIG. 4B, an exemplary configuration of the memory block 211 may include a plurality of cell strings 221 coupled to bit lines BL0 to BLm-1 respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn-1 may be preferably formed of a multi-level cell (MLC) storing data information of multiple bits in each cell. The cell strings 221 may be electrically coupled to the corresponding bit lines BL0 to BLm-1, respectively.

FIG. 4B exemplarily illustrates a memory block 211 comprising a NAND-type flash memory cell. However, the memory block 211 of the semiconductor memory device 200 is not limited to being NAND flash memory. For example, the memory block 211 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control the overall operations including operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. On the other hand, during a verification read operation the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. A target data of the hard and soft decision decoding steps S510 and S530, or the data stored in the semiconductor memory device 200 may be the LDPC-encoded data or the codeword, which is LDPC-encoded by the LDPC unit 130.

For example, the hard decision decoding step S510 may be a step of a hard decision LDPC decoding operation for hard decision read data of predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision LDPC decoding operation for the hard decision read data by forming soft decision read data according to soft decision read voltages $V_{SD}$ around the hard decision read voltage $V_{HD}$ when the hard decision LDPC decoding operation of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, a first error correction decoding is performed which may be a hard decision LDPC decoding operation. The LDPC unit 130 may perform the hard decision LDPC decoding to the hard decision read data, which is read from the semiconductor memory device 200 according to the hard decision read voltage $V_{HD}$ by using the error correction code.

At step S515, it may be determined whether the first error correction decoding, i.e., the hard decision LDPC decoding operation is a success or a fail. That is, at step S515, it may be determined whether an error of the hard decision read data, to which the hard decision LDPC decoding operation is performed at step S513, is corrected. For example, the memory controller 100 may determine whether an error of the hard decision read data is corrected by using the hard decision read data and a parity check matrix. For example, when the result of the parity check matrix and the hard decision read data is a zero vector ('0'), it may be determined that the hard decision read data is corrected. On the other hand, when the result of the parity check matrix and the hard decision read data is not the zero vector ('0'), it may be determined that the hard decision read data is not corrected.

When it is determined that the hard decision read data is corrected as the result of the determination of step S515, it may be determined at step S520 that the read operation according to hard decision read voltage $V_{HD}$ at step S511 is successful and the operation of the memory controller 100 may end. The hard decision read data, to which the hard decision LDPC decoding operation is performed at step S513, may be now the error-corrected data and may be provided externally or used in the memory controller 100.

When it is determined that the hard decision read data is not corrected as the result of the determination of step S515, a second error correction decoding may be performed in step S530 which may be a soft decision decoding.

As described above, at step S531 of the so decision read step, the soft decision read data may be read from the semiconductor memory device 200 according to the soft decision read voltages $V_{SD}$. For example, the additional read operation according to the soft decision read voltages $V_{SD}$ may be performed on the memory cell, to which the hard decision decoding step S510 is performed according to the hard decision read voltage $V_{HD}$. The soft decision read voltages $V_{SD}$ may be different than the hard decision read voltage $V_{HD}$.

At step S533, the soft decision LDPC decoding operation as the second error correction decoding may be performed. The soft decision LDPC decoding operation may be performed based on the soft decision read data comprising the hard decision read data, to which the hard decision LDPC decoding operation is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn-1 of the semiconductor memory device 200 may belong to one of the threshold voltage distributions including 7 program states P1 to P7 and 1 erase state E.

The hard decision read voltage $V_{HD}$ may have a voltage between 2 neighbouring states of the plurality of states (E and P1 to P7). Each of the soft decision read voltages $V_{SD}$ may have a voltage between 2 neighbouring states of the plurality of states (E and P1 to P7), which is different from the hard decision read voltage $V_{HD}$.

The hard decision read data read from the memory cells MC0 to MCn-1 according to the hard decision read voltage $V_{HD}$ and the soft decision read data read therefrom according to the soft decision read voltages $V_{SD}$ may have different values. For example, there may be a tailed memory cell among the memory cells MC0 to MCn-1 having a threshold voltage that is higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn-1 (i.e., additional information on the tailed memory cells) or the log likelihood ratio (LLR) providing reliability of the hard decision read data read by the hard decision read operation may be obtained.

When the additional information is obtained, the probability of the likelihood ratio whether the data of the memory cells MC0 to MCn-1 belong to the first state (i.e., '1'), or the second state (i.e., '0'), may increase. That is, the reliability of the LDPC decoding operation may increase. The memory controller 100 may perform the soft decision LDPC decoding operation based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the second error decoding, i.e., the soft decision LDPC decoding operation succeeds or fails. That is, at step S535, it may be determined whether an error of the soft decision read data, to which the soft decision LDPC, decoding operation is performed at step S533 is corrected. For example, the memory controller 100 may determine whether an error of the soft decision read data is corrected by using the soft decision read data and the parity check matrix. For example, when the result of the parity check matrix and the soft decision read data is a zero vector ('0'), it may be determined that the soft decision read data, to which the soft decision LDPC decoding operation is performed, is corrected. On the other hand, when the result of the parity check matrix and the soft decision read data is not a zero vector ('0'), it may be determined that the soft decision read data, to which the soft decision LDPC decoding operation is performed, is not corrected.

The product process of the parity check matrix and the hard decision read data during the hard decision decoding step S510 may be the same as the product process of the parity check matrix and the soft decision read data during the soft decision decoding step S530. The product process may be the matrix product.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision LDPC decoding operation is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn-1 finally fails and the operation of the memory controller 100 may end.

Figure 6A:
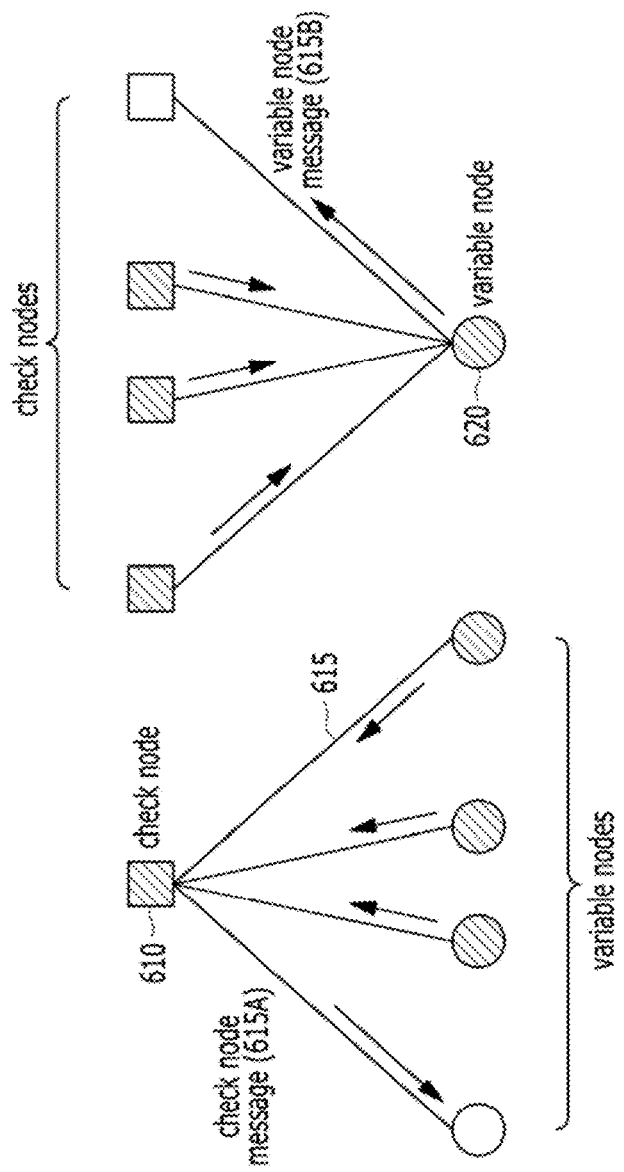
FIG. 6A is a schematic diagram illustrating LDPC decoding represented by a Tanner graph.

FIG. 6A is a schematic diagram illustrating an LDPC decoding operation using a Tanner graph.

Figures 6B, 6C:
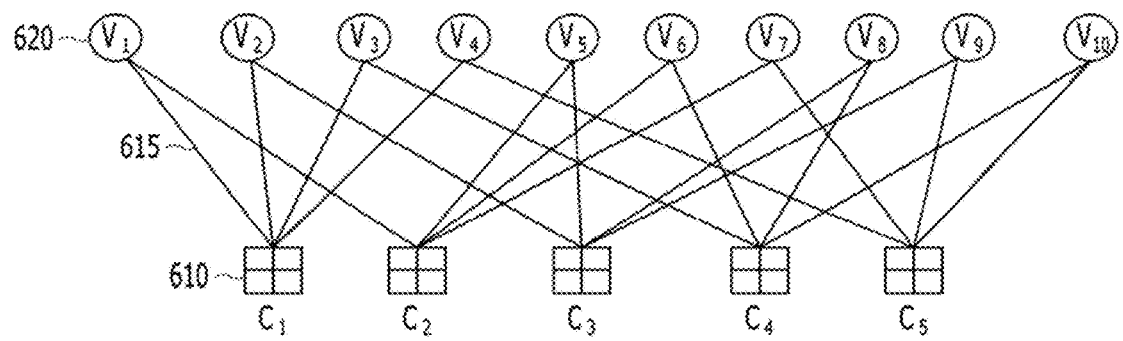
FIG. 6B is a schematic diagram illustrating an LDPC code.
FIG. 6C is a schematic diagram illustrating a syndrome check process according to an LDPC decoding operation.

FIG. 6B is a schematic diagram illustrating an LDPC code.

FIG. 6C is a schematic diagram illustrating a syndrome check process according to the LDPC decoding operation.

An error correction code (ECC) is commonly used in storage systems. Various physical phenomena occurring in storage devices result in noise effects that corrupt the stored information. Error correction coding methods can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding methods, the code is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, decoding can be viewed as an iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of 1s in each row and column is very small, and its structure can be defined by the Tanner graph including check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

A decoding process of the LDPC code may be performed by iterative decoding based on a 'sum-products' algorithm. A decoding method can be provided based on a suboptimal message-passing algorithm such as a 'min-sum' algorithm, which is a simplified version of the sum-product algorithm.

For example, referring to FIG. 6B, the Tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 200 coupled to each of the variable nodes 620 is fixed at 2. An initial value of the variable node 620 may be one of the hard decision read data and the soft decision read data.

FIG. 6C shows a parity check matrix H corresponding to the Tanner graph. The parity check matrix H is similar to the graphic expression of the parity check equations. The parity check matrix H has the same number of 1s in each column and each row. That each column of the parity check matrix H has two is corresponding to the connections between each of the variable nodes 620 and the check nodes 610, and each row has four is corresponding to the connections between each of the check nodes 610 and the variable nodes 620.

A process of decoding the LDPC code performed by iterating a process of exchanging messages which are generated and updated in each node, between the variable nodes 620 and the check nodes 610 in the Tanner graph. In this case, each node updates the messages based on the sum-product algorithm or a similar suboptimal algorithm.

For example, the LDPC decoding operation to the hard decision read data may comprise a plurality of iterations, each of which includes update of the check nodes 610 after an initial update of the variable nodes 620, update of the variable nodes 620, and a syndrome check. After the single iteration, when the result of the syndrome check satisfies a predetermined condition, the LDPC decoding operation may end. When the result of the syndrome check does not satisfy the predetermined condition, an additional iteration may be performed. The additional iteration may include the variable node update, the check node update and the syndrome check. The number of iterations may be limited to a maximum iteration count. When the result of the syndrome check does not satisfy the predetermined condition until the number of iterations reaches the maximum iteration count, the LDPC decoding operation to the codeword may be determined to have failed in LDPC decoding operation.

Referring to FIG. 6C, the syndrome check is a process of identifying whether the product result "Hv′" of the parity check matrix H and a vector "v", which is obtained by the update of the variable nodes 620, satisfies the predetermined condition. When the product result "Hv′" becomes the zero vector, the product result "Hv′" may be evaluated to satisfy the predetermined condition.

FIG. 6C shows the syndrome check process. FIG. 6C exemplarily shows a non-zero vector "01100" as the product result "Hv′", and thus FIG. 6C shows that the syndrome check does not satisfy the predetermined condition and another single iteration should be performed according to another hard decision read voltage $V_{HD}$.

Considering the non-zero vector "01100" as the product result "Hv′", the number of non-zero vector elements or elements, which do not meet the zero vector condition, is 2. In the description, the elements that do not meet the zero vector condition of the syndrome check for the product result "Hv′" in the single iteration is defined as unsatisfied syndrome check (USC). FIG. 6C shows the result of the syndrome check where the number of the USC is 1.

Figure 7A:
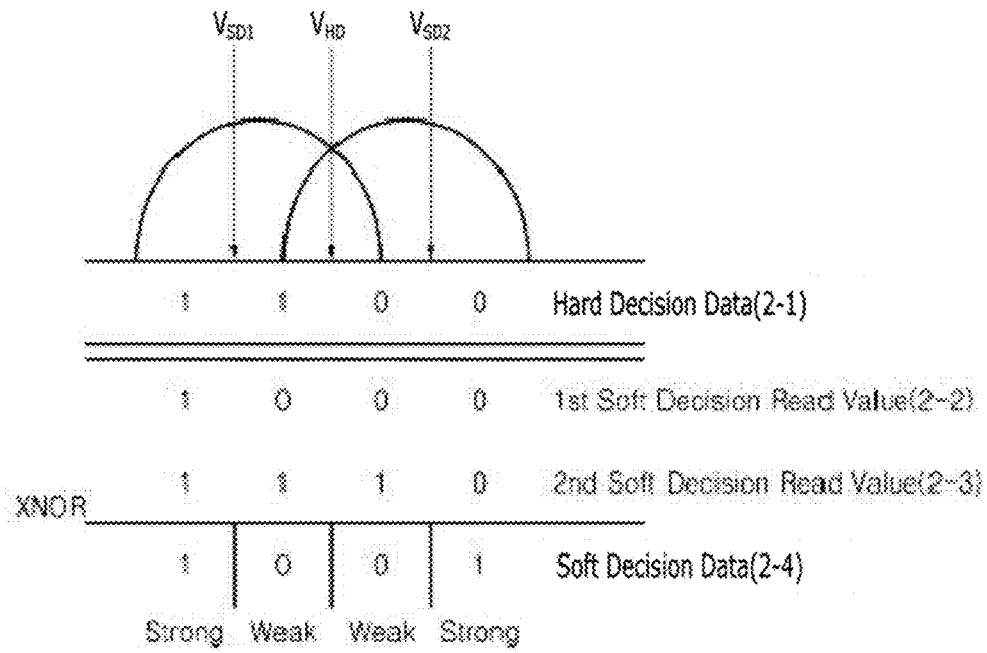
FIG. 7A is a schematic diagram illustrating a 2-bit soft decision read operation as a soft decision read operation shown in FIG. 5.
Figure 7B:
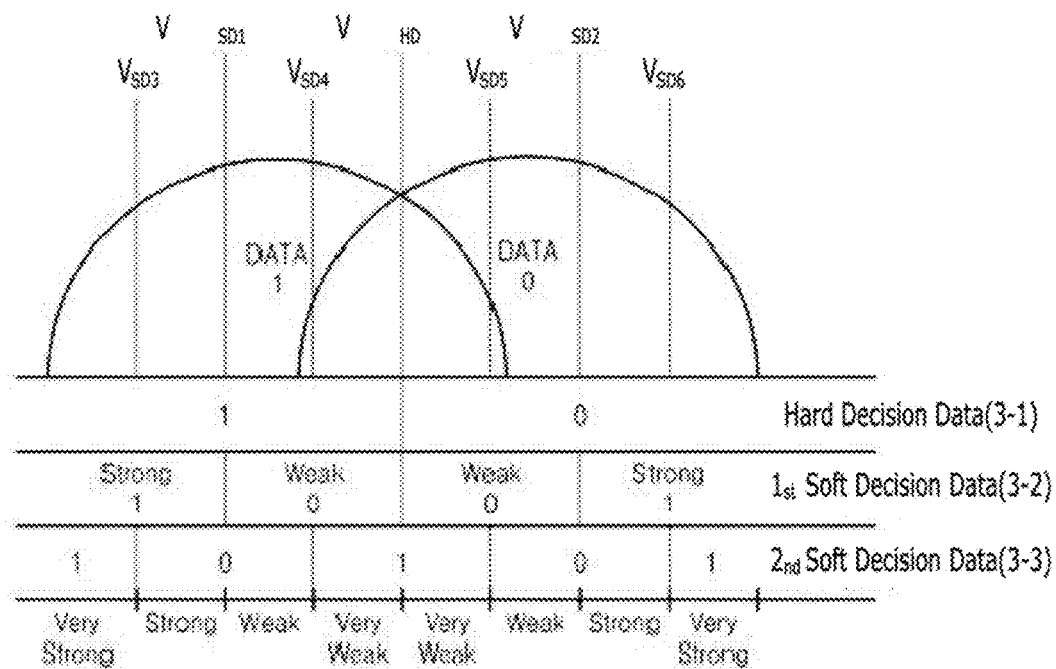
FIG. 7B is a schematic diagram illustrating a 3-bit soft decision read operation as a soft decision read operation shown in FIG. 5.

FIGS. 7A and 7B are schematic diagrams illustrating the soft decision read operation shown in FIG. 5 particularly 2-bit and 3-bit soft decision read operations, respectively.

Referring to FIG. 7A, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different voltages from the hard decision read voltage $V_D$, are applied to the memory cell.

Referring to FIG. 7A, during the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the LDPC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses (the logic values of '1' and '0') of the hard decision read data 2-1. On the other hand, the value '0' of the soft decision read data 2-4 may show a "weak" probability of the first and second statuses of the hard decision read data 2-1.

Referring to FIG. 7B, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, which have different voltages from the hard decision read voltage $V_{HD}$, are applied to the memory cells.

Referring to FIG. 7B, during the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 7A. The LDPC unit 130 may generate a first soft decision read data 3-2 '1001' or the LLR through an XNOR operation to the st and second soft decision read values.

In a similar way, during the 3-bit oft decision read operation, third to sixth soft decision read values may be generated according to the on/off status of the memory cell when third to sixth soft decision read voltages $V_{SD3}$ to $V_{SD6}$, which have different voltages from the first and second soft decision read voltages $V_{SD1}$ and $V_{SD2}$ are applied to the memory cell, which is similar to the 2-bit soft decision read operation described with reference to FIG. 7A. The LDPC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status (the logic value of '1') of the first soft decision read data 3-2. On the other hand, the value '0' of the second soft decision read data 3-3 may show a "strong" probability of the first status of the first soft decision read data 3-2.

In a similar way, the value '1' of the second soft decision read data 3-3 may show a "very weak" probability of the second status (the logic value of '0') of the first soft decision read data 3-2. On the other hand, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 7A.

Figure 8A:
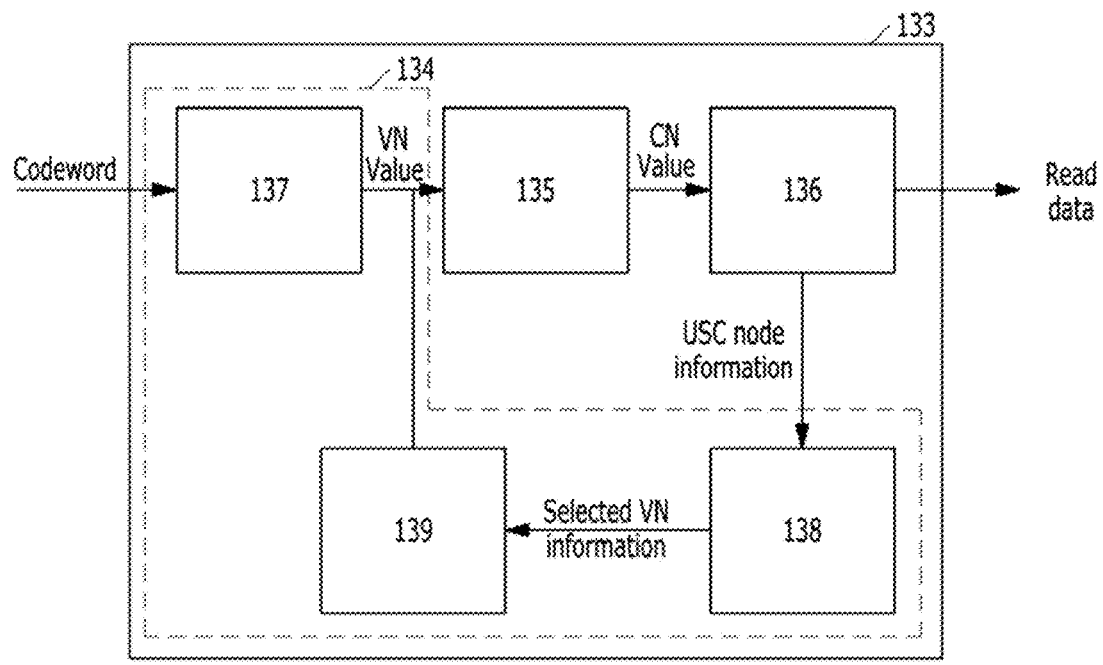
FIG. 8A is a detailed block diagram illustrating an LDPC decoder of FIG. 3.

FIG. 8A is a detailed block diagram illustrating an exemplary configuration of the LDPC decoder 133.

Figure 8B:
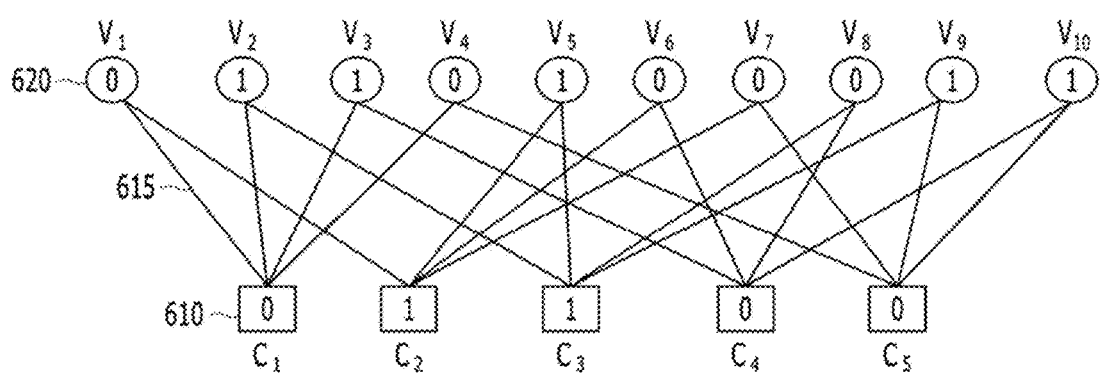
FIG. 8B is a schematic diagram illustrating an initial iteration of an LDPC decoding operation.

FIG. 8B is a schematic diagram illustrating an initial iteration of an LDPC decoding operation.

Figure 8C:
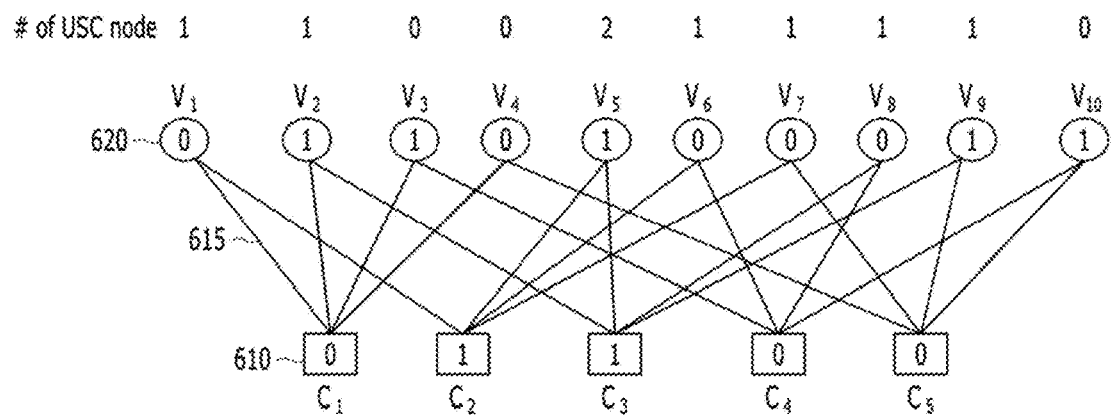
FIG. 8C is a schematic diagram illustrating a process of selecting a variable node during second and subsequent iterations.
Figure 8D:
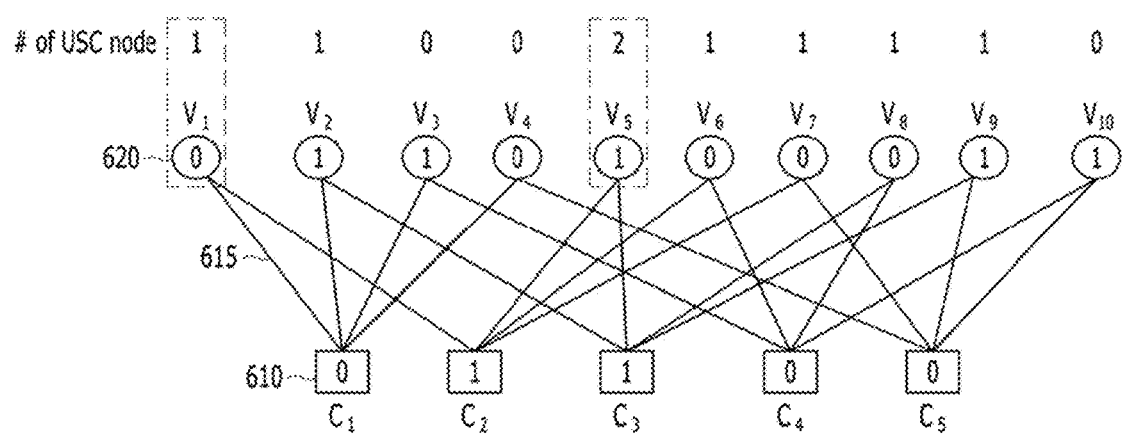
FIG. 8D is a schematic diagram illustrating a process of selecting a variable node during second and subsequent iterations.
Figure 8E:
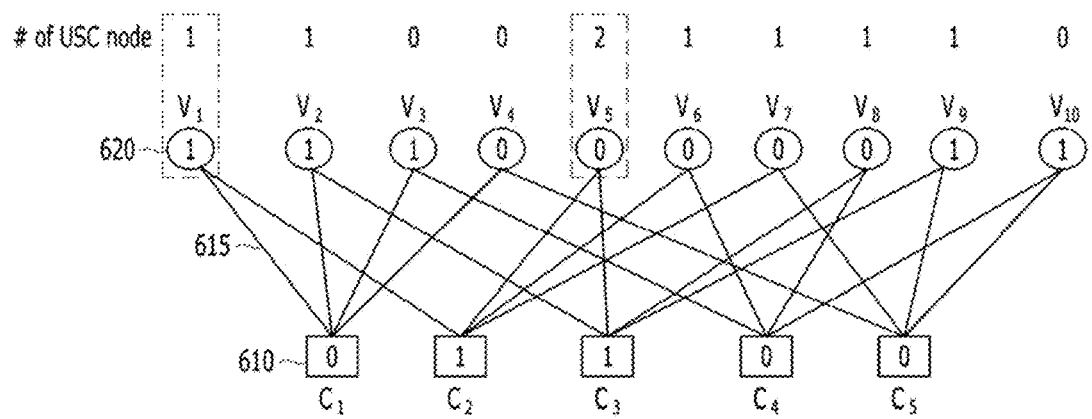
FIG. 8E is a schematic diagram illustrating a process of flipping a variable node during second and subsequent iterations.

FIGS. 8C to 8E are schematic diagrams illustrating a process of selecting a variable node during second and subsequent iterations.

As described above with reference to FIG. 6C, the LDPC decoder 133 may perform the LDPC decoding operation to the hard decision data having a predetermined length and read from the memory cell of the memory block 211 according to the first hard decision read voltage $V_{HD}$ by performing a plurality of iterations, each of which includes a variable node update, a check node update, and a syndrome check. In accordance with an embodiment of the present invention, during the initial iteration, the LDPC decoder 133 may perform the variable node update by respectively allocating symbols of a codeword to the variable nodes 620 as variable node values thereof (i.e., by initializing the variable nodes 620). Further, during each of second and subsequent iterations, the LDPC decoder 133 may perform the variable node update by flipping the variable node values of the variable nodes 620. The number of flips may be limited to a predetermined maximum flip number. The predetermined maximum flip number may be an integer greater than 2, and for example, may be 2, 4 or 16. The number of iterations may be limited to a predetermined maximum iteration number.

Referring to FIG. 8A, the LDPC decoder 133 may include a variable node update unit 134, a check node update unit 135 and a syndrome check unit 136. The variable node update unit 134 may include a variable node initialization part 137, a variable node selection part 138 and a variable node flipping part 139.

The LDPC decoder 133 may perform the LDPC decoding operation to the codeword by controlling the variable node update unit 134 to perform the variable node update, the check node update unit 135 to perform the check node update, and the syndrome check unit 136 to perform the syndrome check.

In accordance with an embodiment of the present invention, the variable node updates may be different between the initial iteration and the second and subsequent iterations. Particularly, the variable node initialization part 137 may perform the variable node update during the initial iteration, whereas the variable node selection part 138 and the variable node flipping part 139 may perform the variable node update during the second and subsequent iterations. That is, the variable node update may be performed by the variable node initialization part 137 during the initial iteration and by the variable node selection part 138 and the variable node flipping part 139 during the second and subsequent iterations.

During the initial iteration, the variable node initialization part 137 may perform the variable node update by respectively allocating the symbols of the codeword to the variable nodes 620 as the variable node values (i.e. by initializing the variable nodes 620). During the second and subsequent iterations, the variable node selection part 138 and the variable node flipping part 139 may perform the variable node update by selecting some of the variable nodes 620 and by flipping the variable node values of the selected variable nodes 620.

Hereinafter, described with reference to FIG. 8B will be the initial iteration by the variable node initialization part 137, the check node update unit 135 and the syndrome check unit 136. It is assumed that the maximum iteration number is 50.

The variable node initialization part 137 may perform the variable node update by reading the encoded data or the codeword programmed in the semiconductor memory device 200 and by respectively allocating the symbols of the read codeword to the variable nodes 620 as the variable node values (i.e., by initializing the variable nodes 620).

As exemplified in FIG. 8B, when the symbols of the codeword read by the variable node initialization part 137 are "0", "1", "1", "0", "1", "0", "0", "0", "1" and "1" the variable node initialization part 137 may perform the variable node update by respectively allocating the symbols of the read codeword to the variable nodes 620 as the variable node values (i.e., by initializing the variable nodes 620). That is, "0" may be allocated as the variable node value of the first variable node V1, "1" may be allocated as the variable node value of the second variable node V2 and "1", "0", "1", "0", "0", "0", "1" and "1" may be allocated as the variable node values of the third to tenth variable nodes V3 to V10, respectively. The respective variable node values may be bit values stored in the respective variable nodes V1 to V10.

The check node update unit 135 may then perform a check node update to the check nodes, which are linked to the variable nodes 620 through the edges 615 based on the parity check matrix H and the variable node values of the variable nodes 620. As described above with reference to FIG. 6B, the check nodes 610 and the variable nodes 620 may be linked to each other through the edges 615 based on the parity check matrix H.

Particularly, the check node update unit 135 may perform the check node update by allocating "1" as the check node value to the check nodes 610, to which an odd number of the variable nodes 620 having the variable node values of "1" are linked, and by allocating "0" to the check node value of the check nodes 610, to which an even number of the variable nodes 620 or no variable nodes 620 having the variable node values of "1" are linked. The check node having the check node value of "1" may be the unsatisfied syndrome check (USC) node.

As exemplified in FIG. 8B, "0" may be allocated as the check node value of the first check node C1, to which an even number of variable nodes (i.e., the second and third variable nodes V2 and V3) having the variable node values of "1" are linked, and "1" may be allocated as the check node value of the second check node C2, to which an odd number of variable nodes (i.e., the fifth variable node V5) having the variable node values of "1" are linked. In similar way, "1", "0" and "0" may be allocated as the check node values of the third to fifth check nodes C3 to C5, respectively. The respective check node values may be bit values stored in the respective check nodes C1 to C5. As exemplified in FIG. 8B, the check nodes (i.e., the second and third check nodes C2 and C3) having the check lode values of "1" may be the USC nodes.

The syndrome check unit 136 may then determine whether to perform another single iteration or end the LDPC decoding operation depending on a number of performed iterations and whether or not there is a USC node. Particularly, the syndrome check unit 136 may determine to perform another single iteration when there is a USC node and the number of the performed iteration is not over the maximum iteration number. The syndrome check unit 136 may determine the LDPC decoding operation as failed and determine to end the LDPC decoding operation when there is a USC node and the number of the performed iteration is over the maximum iteration number. The syndrome check unit 136 may determine the LDPC decoding operation as successful and determine to end the LDPC decoding operation when there is no USC node.

As exemplified in FIG. 8B, during the initial iteration, which is not over the maximum iteration number (i.e., 50 times as assumed), when the second and third check nodes C2 and C3 are USC nodes, the syndrome check unit 136 may determine to perform another iteration i.e., the second iteration.

Hereinafter, described with reference to FIGS. 8C to 8E will be the second and subsequent iterations by the variable node selection part 138, the variable node flipping part 139, the check node update unit 135 and the syndrome check unit 136. It is assumed that the maximum iteration number is 50.

When the syndrome check unit 136 determines to perform another single iteration, the variable node selection part 138 may select one or more among the variable nodes 620 linked to the USC nodes, a number of which is greater than a predetermined threshold. The predetermined threshold as a reference value for selecting the variable nodes may be determined differently for the respective iterations. For example, when the maximum iteration number is 50, the predetermined threshold may be set to 4 for the initial iteration, set to 6 for the last $50^{th}$ iteration, and set to a value gradually decreasing as the number of iterations increases between the initial iteration to the last $50^{th}$ iteration. The number of selected variable nodes 620 may not exceed the predetermined maximum flip number. The predetermined maximum flip number may be an integer greater than 2, and for example, may be 2, 4 or 16.

As exemplified in FIG. 8C, a number of USC nodes linked to the first variable node V1 is 1 since the first variable node V1 is linked to a single USC node (i.e., the second check node C2), a number of USC nodes linked to the second variable node V2 is 1 since the second variable node V2 is linked to a single USC node (i.e., the third check node C3). Numbers of USC nodes linked to the third to tenth variable nodes V3 to V10 are "0", "0", "2", "1", "1", "1" and "0", respectively. That is, the numbers of USC nodes linked to the first to tenth variable node V1 to V10 are "1", "1", "0", "0", "2", "1", "1", "1" and "0", respectively.

In an embodiment, the variable node selection part 138 may select, within the predetermined maximum flip number, one or more among the variable nodes 620 linked to the USC nodes, the number of which is greater than the predetermined threshold through a first selection method of selecting the variable nodes 620 in order of the number of the USC nodes linked thereto.

In another embodiment, the variable node selection part 138 may select, within the predetermined maximum flip number, one or more among the variable nodes 620 linked to the USC nodes, the number of which is greater than the predetermined threshold through a second selection method of dividing the whole variable nodes 620 into groups, a number of which is the maximum flip number and selecting in each of the groups a single variable node linked to the greatest number of the USC nodes among the variable nodes 620 linked to the USC nodes, the number of which is greater than the predetermined threshold.

When there are several variable nodes 620 linked to the same number of the USC nodes method, the variable node selection part 138 may select a first one or a last one among the several variable nodes 620 according to an order of the several variable nodes 620 or may randomly select one among the several variable nodes 620.

Hereinafter, described with reference to FIG. 8D will be the selecting of the variable nodes 620 through the first selection method by the variable node selection part 138 when the predetermined threshold is 1 and the predetermined maximum flip number is 2.

As exemplified in FIG. 8D, the variable node selection part 138 may select the fifth variable node V5 linked to the greatest number of the USC nodes among the variable nodes V1. V2 and V5 to V9 linked to the USC nodes, the number of which is greater than the predetermined threshold of 1. Then, the variable node selection part 138 may select the first variable node V1 among the variable nodes V1, V2 and V6 to V9 linked to the second greatest number of the USC nodes in the variable nodes V1, V2 and V5 to V9 linked to the USC nodes, the number of which is greater than the predetermined threshold of 1 as assumed for this example. At this time, among the variable nodes V1, V2 and V6 to V9 linked to the same number of the USC nodes the variable node selection part 138 may select the first variable node V1 or the ninth variable node V9 according to the order of the variable nodes V1, V2 and V6 to V9 or may select a random one among the variable nodes V1, V2 and V6 to V9. Thereby, the variable node selection part 138 may select the fifth and first variable nodes V5 and V1, i.e., as many as the predetermined maximum flip number of 2 as assumed for this example.

Hereinafter, described with reference to FIG. 8E will be the selecting of the variable nodes 620 through the second selection method by the variable node selection part 138 when the predetermined threshold is 1 and the predetermined maximum flip number is 2.

A relationship between the number of the variable nodes 620 and the maximum flip number may be represented by equation 1, as follows.

$$N_{vn} = \left[\frac{N_{vn}}{N_{fMax}}\right] + \alpha \qquad \text{[Equation 1]}$$

Wherein, in equation 1, $N_{vn}$ represents the number of the variable nodes 620, $N_{fMax}$ represents the maximum flip number, and represents a remainder when the number of the variable nodes 620 is divided by the maximum flip number.

A number of the variable nodes 620 included in each of the groups may be represented by equation 2, as follows, $$G_i = \begin{cases} \left[\frac{N_{vn}}{N_{fMax}}\right] + 1, \text{if}, \ i \leq \alpha \\ \left[\frac{N_{vn}}{N_{fMax}}\right], \text{if}, \ i > \alpha \end{cases} \qquad \text{[Equation 2]}$$

wherein, in Equation 2, $G_i$ represents a number of the variable nodes 620 included in the i-th group, and "i" is an integer ranging from 1 to $N_{fMax}$.

For example, according to equations 1 and 2, when the number $N_{vn}$ of the variable nodes 620 is 20 and the predetermined maximum flip number $N_{fMax}$ is 2, the number of the variable nodes 620 included in each of the first and second groups $G_1$ and $G_2$ is 10. When the number $N_{vn}$ of the variable nodes 620 is 20 and the predetermined maximum flip number $N_{fMax}$ is 3, the number of the variable nodes 620 included in each of the first and second groups $G_1$ and $G_2$ is 7 and the number of the variable nodes 620 included in the third group $G_3$ is 6.

As exemplified in FIG. 8E, the variable node selection part 138 may divide the whole variable nodes 620 into first and second groups, the number of which is the predetermined maximum flip number, in order of the variable nodes 620. In the first group of first to fifth variable nodes V1 to V5, the variable node selection part 138 may select the fifth variable node V5 inked to the greatest number of the USC nodes. In the second group of the sixth to tenth variable nodes V6 to V10, the variable node selection part 138 may select one of the sixth to ninth variable nodes V6 to V9 each linked to the greatest number of the USC nodes. At this time, among the sixth to ninth variable nodes V6 to V9 linked to the same number of the USC nodes in the second group, the variable node selection part 138 may select the sixth variable node V6 or the ninth variable node V9 according to the order of the sixth to ninth variable nodes V6 to V9 or may select a random one among the sixth to ninth variable nodes V6 to V9. Thereby, for example, the variable node selection part 138 may select two variable nodes, namely the fifth and sixth variable nodes V5 and V6, i.e., as many variable nodes as the predetermined maximum flip number of 2 as assumed in this example.

As described above, within the predetermined maximum flip number, the variable node selection part 138 may select through the first and second selection methods one or more among the variable nodes 620 linked to the USC nodes, a number of which is greater than the predetermined threshold.

The variable node flipping part 139 may flip the variable node values of the variable nodes 620 selected by the variable node selection part 138. The variable node flipping part 139 may flip the variable node values by changing an original variable node value of "0" to "1" and vice versa.

As exemplified in FIG. 8D, when the first and fifth variable nodes V1 and V5 are selected by the variable node selection part 138, the variable node flipping part 139 may flip the original variable node values "0" and "1" of the first and fifth variable nodes V1 and V5 to the values "1" and "0", respectively. FIGS. 8C and 8D exemplify the variable node values of the first and fifth variable nodes V1 and V5 flipped from the original values "0" and "1" to the values "1" and "0", respectively. Accordingly, the variable node values of the respective variable nodes 620 may be flipped to become "1", "1", "1", "0", "0", "0", "0", "0", "1" and "1".

As exemplified in FIG. 8E, when the fifth and sixth variable nodes V5 and V6 are selected by the variable node selection part 138, the variable node flipping part 139 may flip the original variable node values "0" and "1" of the fifth and sixth variable nodes V5 and V6 to the values "1" and "0", respectively. FIGS. 8C and 8E exemplify the variable node values of the fifth and sixth variable nodes V5 and V6 flipped from the original values "0" and "1" to the values "1" and "0", respectively. Accordingly, the variable node values of the respective variable nodes 620 may be flipped to become "0", "1", "1", "0", "0", "1", "0", "0", "1" and "1".

The check node update unit 135 may perform the check node update to the check nodes, which are linked to the variable nodes 620 through the edges 615 based on the parity check matrix H and the variable node values of the variable nodes 620 which are updated by the variable node flipping part 139. Particularly, the check node update unit 135 may perform the check node update by allocating "1" as the check node value to the check nodes 610, to which an odd number of the variable nodes 620 having the variable node values of "1" are linked and by allocating "0" as the check node value to the check nodes 610, to which an even number of the variable nodes 620 or no variable nodes 620 having the variable node values of "1" are linked.

The syndrome check unit 136 may determine whether to perform another single iteration or end the LDPC decoding operation depending on a number of performed iterations and whether or not there is a USC node.

Figure 8F:
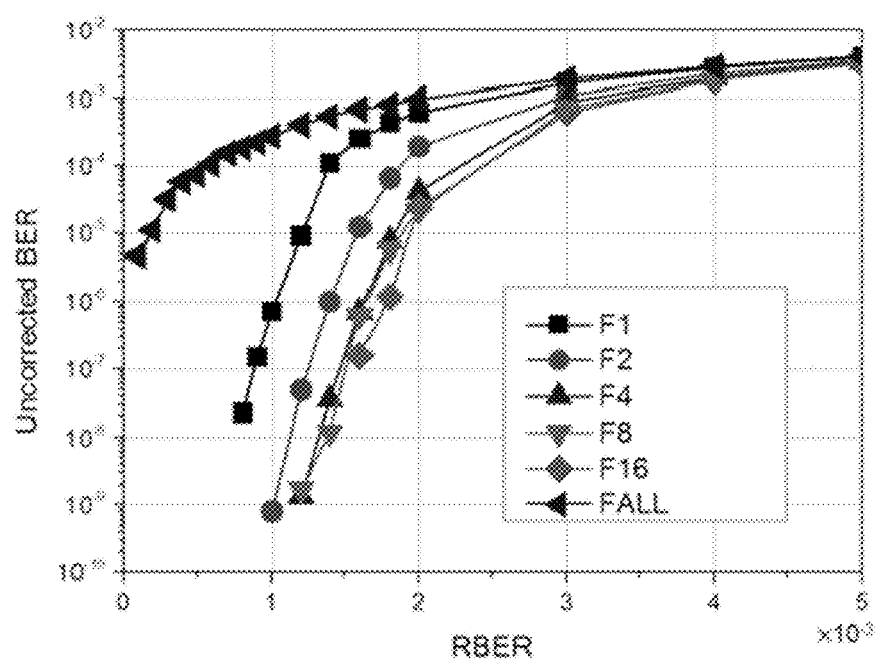

FIG. 8F is a simulation graph illustrating an operation of the LDPC decoder 133.

FIG. 8F illustrates the uncorrected bit error rates (BERs) according to the raw bit error rates (RBERs) of the LDPC decoders (represented by F2, F4, F8 and F16 in FIG. 8F) flipping the variable node values of the variable nodes, the number of which is not greater than the predetermined maximum flip number, in order of the USC values in accordance with various exemplary embodiments of the present invention, and of the LDPC decoders (represented by F1 and FALL in FIG. 8F) according to the prior art. The predetermined maximum flip number is 2 in case of the LDPC decoder F2, 4 in case of the LDPC decoder F4, 8 in case of the LDPC decoder F8 and 16 in case of the LDPC decoder F16. The LDPC decoder F1 flips the variable node value of a single variable node. The LDPC decoder FALL flips the variable node values of all of the variable nodes having the USC values over a predetermined threshold value.

As illustrated in FIG. 8F, in the same situation of RBER (e.g., $2 \times 10^{-3}$ RBER), the performance of the LDPC decoders become improved (i.e., the LIBER decreases) as the number of flipped variable nodes increases during a single iteration. However, the LDPC decoder FALL flipping the variable node values of all of the variable nodes having the USC values over a predetermined threshold value shows lower performance than that of the LDPC decoder F1 flipping the variable node value of a single variable node. Therefore, it is required to limit the number of flipped variable nodes during a single iteration to the predetermined maximum flip number, and it is shown that the performance of the LDPC decoder becomes improved when limiting the maximum flip number.

Referring to FIG. 8F, the performance of the LDPC decoders becomes improved, i.e., the error-correction capability increases and delay is reduced as the number of flipped variable nodes increases during a single iteration. However, the LDPC decoder FALL flipping the variable node values of all of the variable nodes having the USC values over a predetermined threshold value shows decreasing performance, i.e., decreasing error-correction capability and increasing delay. Therefore the performance of the LDPC decoder becomes improved when limiting the number of flipped variable nodes during a single iteration to the predetermined maximum flip number.

As illustrated in FIG. 8F, the simulation result of an operation of the LDPC decoder shows that the performance of the LDPC decoder in accordance with various exemplary embodiments of the present invention is better than that of the LDPC decoder of the prior art.

In accordance with various exemplary embodiments of the present invention, the LDPC decoder 133 may flip the variable node values of the variable nodes 620, the number of which is not greater than a predetermined maximum flip number, among the variable nodes 620 linked to the USC nodes, a number of which is greater than a predetermined threshold, during the second and subsequent iterations. This LDPC decoder 133 shows better performance than the LDPC decoder flipping the variable node value of a single variable node or flipping the variable node values of all of the variable nodes having the USC values over a predetermined threshold value. Therefore, in accordance with various exemplary embodiments of the present invention, data stored in the semiconductor memory device may be read with improved rapidity and precision through an LDPC decoding operation with a limited number of flipped variable nodes during a single iteration.

FIG. 9 is a block diagram schematically illustrating an electronic device 10000 including a memory controller 15000 and a semiconductor memory device 16000 in accordance with an embodiment of the present invention.

Referring to FIG. 9, the electronic device 10000 may be any suitable electronic device such as a cellular phone, a smart phone, or a tablet PC including the semiconductor memory device 16000 and the memory controller 15000. The semiconductor memory device 16000 may be implemented by any suitable memory device, including, for example, a flash memory device, such as NAND or a NOR flash. The memory controller 15000 may control the semiconductor memory device 16000.

The semiconductor memory device 16000 may correspond to the semiconductor memory device 200 described above with reference to FIGS. 3 to 46. The semiconductor memory device 16000 may store random data.

The memory controller 15000 may correspond to the memory controller 100 described with reference to FIGS. 3 to 8E. The memory controller 15000 may be controlled by a processor 11000 which may control the overall operations of the electronic device 10000.

Data stored in the semiconductor memory device 16000 may be displayed through a display 13000 under the control of the memory controller 15000. The memory controller 15000 may operate under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000. The input device 14000 may be implemented, for example, by a pointing device such as a touch pad or a computer mouse, a key pad, or a keyboard.

The processor 11000 may control the display 13000 so that the data from the semiconductor memory device 16000, the radio signal from the radio transceiver 12000 or the data from the input device 14000 is displayed through the display 13000.

FIG. 10 is a block diagram schematically illustrating an electronic device 20000 including a memory controller 24000 and a semiconductor memory device 25000 in accordance with another embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device, and the memory controller 24000 to control the operations of the semiconductor memory device 25000.

The electronic device 20000 may include a processor 21000 to control the overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented, for example, by a pointing device such as a touch pad or a computer mouse, a key pad, or a keyboard.

FIG. 11 is a block diagram schematically illustrating an electronic device 30000 including a controller 32000 and a semiconductor memory device 34000 in accordance with yet another embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic device 30000 may include a card interface 31000, the controller 32000, and the semiconductor memory device 34000 which may be implemented, for example, with a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control the overall operations of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC a digital camera, a digital audio player, a mobile phone, console video game hardware or a digital set-top box, the host may exchange data with the semiconductor memory device 34000 through the card interface 31000 and the controller 32000.

FIG. 12 is a block diagram schematically illustrating an electronic device 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic device 40000 may include the semiconductor memory device 45000, e.g., a flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

FIG. 13 is a block diagram schematically illustrating an electronic device 60000 including a memory controller 61000 and semiconductor memory devices 62000A, 62000B, and 62000C in accordance with yet another embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8E, respectively.

Referring to FIG. 13, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

FIG. 14 is a block diagram of a data processing system including the electronic device 6000 described with reference to FIG. 13.

Figure 1:
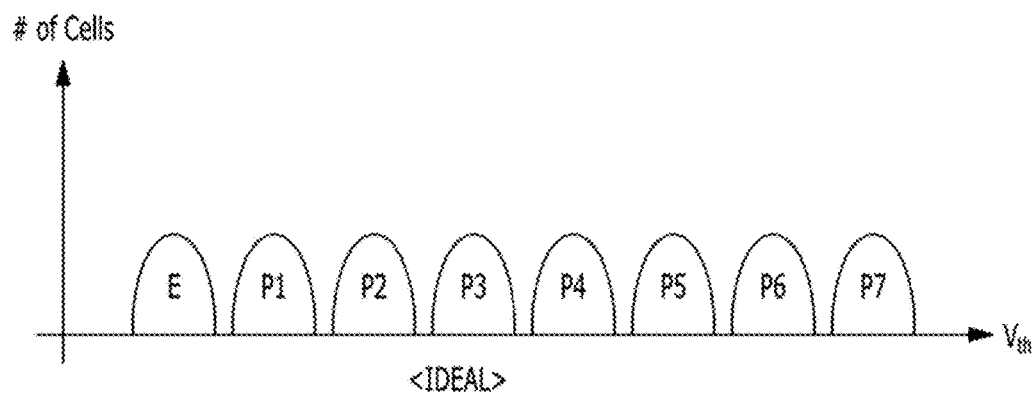
FIG. 1 is a threshold voltage distribution schematically illustrating program and erase states of a 3-bit MLC non-volatile memory device.
Figure 2:
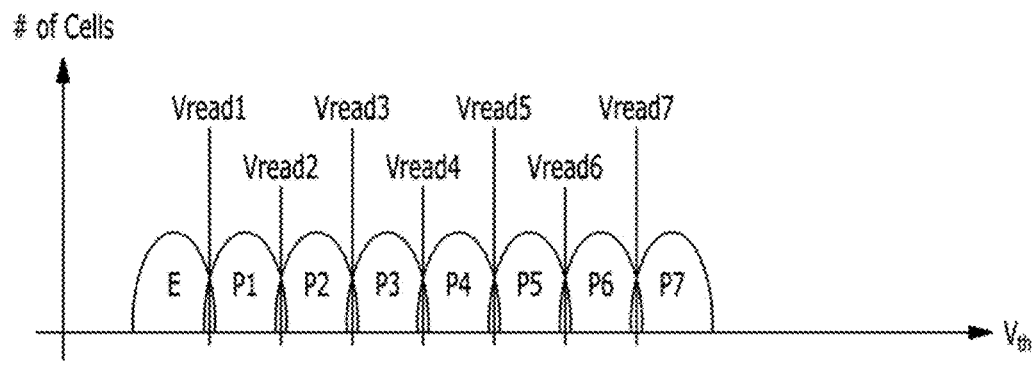
FIG. 2 is a threshold voltage distribution schematically illustrating program and erase states due to characteristic deterioration of a 3-bit. MLC non-volatile memory device.

Referring to FIGS. 1 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N selected according to one of a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. An operation method of a Low Density Parity Check (LDPC) decoder, the operation method comprising:
   initializing, by a variable node update unit, variable nodes of a Tanner graph representing a parity check matrix defining an LDPC code;
   performing, by a check node update unit, a check node update to check nodes of the Tanner graph based on variable node values of the variable nodes;
   performing, by a syndrome check unit, a variable node update when there are one or more unsatisfied syndrome check (USC) nodes among the updated check nodes as a result of the check node update; and
   repeating, by the check node update unit and the syndrome check unit, the performing of the check node update and the variable node update when there are one or more USC nodes as the result of the check node update,
   wherein the performing, by the syndrome check unit, of the variable node update includes:
   selecting among the variable nodes a predetermined number of variable nodes having a USC value greater than a predetermined threshold; and
   flipping the variable node values of the selected variable nodes, and
   wherein the USC value is a number of the USC nodes linked to corresponding one of the variable nodes,
   wherein the selecting the predetermined number of variable nodes includes
   dividing the variable nodes into a predetermined number of groups,
   selecting variable nodes having greatest USC values in the respective groups, and
   wherein a predetermined maximum flip number is variable according to a repetition number of the variable node update.

2. The operation method of claim 1, wherein the variable nodes are selected according to an order of the USC values.

3. The operation method of claim 1, wherein the predetermined threshold is variable according to a repetition number of the variable node update.

4. The operation method of claim 1, further comprising determining a decoding of the LDPC decoder as successful when there is no USC nodes as the result of the check node update.

5. A Low Density Parity Check (LDPC) decoder comprising:
   a variable node update unit suitable for initializing variable nodes of a Tanner graph representing a parity check matrix defining an LDPC code;
   a check node update unit suitable for performing a check node update to check nodes of the Tanner graph based on variable node values of the variable nodes; and
   a syndrome check unit suitable for performing a variable node update when there is one or more unsatisfied syndrome check (USC) nodes among the updated check nodes as a result of the check node update,
   wherein the check node update unit and syndrome check unit repeat the check node update and the variable node update when there is one or more USC nodes as the result of the check node update, wherein the syndrome check unit includes:

a variable node selection part suitable for selecting, among the variable nodes, a predetermined number of variable nodes having an USC value greater than a predetermined threshold; and a variable node flipping part suitable for flipping the variable node values of the selected variable nodes, and wherein the USC value is a number of the USC nodes linked to corresponding one of the variable nodes, wherein the variable node selection part selects the variable nodes by dividing the variable nodes into the predetermined number of groups, and selecting variable nodes having greatest USC values in the respective groups, wherein a predetermined maximum flip number is variable according to a repetition number of the variable node update.

6. The LDPC decoder of claim 5, wherein the variable node selection part selects the variable nodes in order of the USC values among the variable nodes having the USC value.

7. The LDPC decoder of claim 5, wherein the predetermined threshold is variable according to a repetition number of the variable node update.

8. The LDPC decoder of claim 5, further comprising a fourth unit suitable for determining a decoding of the LDPC decoder as successful when there is no USC nodes as the result of the check node update.

9. A semiconductor memory system comprising:

a semiconductor memory device; and a Low Density Parity Check (LDPC) decoder, wherein the LDPC decoder includes:

a variable node update unit suitable for initializing variable nodes of a Tanner graph representing a parity check matrix defining an LDPC code;

a check node update unit suitable for performing a check node update to check nodes of the Tanner graph based on variable node values of the variable nodes; and a syndrome check unit suitable for performing a variable node update when there is one or more unsatisfied syndrome check (USC) nodes among the updated check nodes as a result of the check node update, wherein the check node update unit and syndrome check unit repeat the check node update and the variable node update when there is one or more USC nodes as the result of the check node update, wherein the syndrome check unit includes:

a variable node selection part suitable for selecting, among the variable nodes, a predetermined number of variable nodes having an USC value greater than a predetermined threshold; and a variable node flipping part suitable for flipping the variable node values of the selected variable nodes, and wherein the USC value is a number of the USC nodes linked to corresponding one of the variable nodes, wherein the variable node selection part selects the variable nodes by dividing the variable nodes into a predetermined number of groups, and selecting variable nodes having greatest USC values in the respective groups, wherein a predetermined maximum flip number is variable according to a repetition number of the variable node update.

10. The semiconductor memory system of claim 9, wherein the variable node selection part selects the variable nodes according to an order of the USC values among the variable nodes having the USC value.

11. The semiconductor memory system of claim 9, wherein the predetermined threshold is variable according to a repetition number of the variable node update.

12. The semiconductor memory system of claim 9, wherein the LDPC decoder further includes a fourth unit suitable for determining a decoding of the LDPC decoder as successful when there is no USC nodes as the result of the check node update.

* * * * *